United States Patent [19]

Saxena

[11] Patent Number: 5,469,114

[45] Date of Patent: Nov. 21, 1995

[54] LOSS LESS RF FEEDBACK FOR POWER AMPLIFIER LINEARIZATION

[75] Inventor: Vinod K. Saxena, Simi Valley, Calif.

[73] Assignee: Advanced Milliwave Laboratories, Inc., Camarillo, Calif.

[21] Appl. No.: 317,178

[22] Filed: Oct. 3, 1994

[51] Int. Cl.⁶ .................................................. H03F 1/34
[52] U.S. Cl. ............................ 330/107; 330/53; 330/294; 330/306
[58] Field of Search ....................... 330/53, 56, 57, 330/149, 107, 294, 306; 455/50.1, 63, 126

[56] References Cited

U.S. PATENT DOCUMENTS

| | | |
|---|---|---|
| 3,638,134 | 1/1972 | Beurrier et al. ........................ 333/149 |
| 3,909,742 | 9/1975 | Cox et al. ................................. 333/84 |
| 4,656,434 | 4/1987 | Selin ...................................... 333/53 X |
| 4,816,788 | 3/1989 | Ishikawa et al. ..................... 333/53 X |
| 5,237,288 | 8/1993 | Cleveland .............................. 333/107 |

*Primary Examiner*—James B. Mullins
*Attorney, Agent, or Firm*—Jack C. Munro

[57] ABSTRACT

The method and apparatus for improving linearization of a radio frequency power amplifier which includes extracting a small portion of the output signal of the power amplifier and utilizing this extracted signal as a feedback signal. The feedback signal is then adjusted in phase, attenuated, and combined with the input signal of the power amplifier and then filtered prior to being transmitted to the power amplifier.

7 Claims, 1 Drawing Sheet

LOSS LESS RF FEEDBACK FOR POWER AMPLIFIER LINEARIZATION

BACKGROUND OF THE INVENTION

1) Field Of The Invention

The field of this invention relates to a unique, simple and cost effective technique for improving the linearity of a power amplifier for banded applications such as are found in mobile and cellular and microwave communication bands.

2) Description Of The Prior Art

The Federal Communications Commission (FCC) has stringent requirements for mobile and cellular communications. One of these requirements is that the communication circuit must be highly linear. The more linear the system, the less noise is created. The less noise, the higher the quality of the cellular signal. Also, the possibility of interference between signals is decreased.

By using Code Division Multiple Access (CDMA) and Time Division Multiple Access (TDMA), channel capacity can be increased significantly. Let it be assumed that one is able to obtain five hundred channels within every two megahertz (MHz) of output of a power amplifier. By using CDMA and TDMA the channel capacity can be increased by approximately a factor of ten. Therefore, instead of getting only five hundred channels with two MHz there can be obtained five thousand channels. With the increase in the number of channels, there is the need for better linearity.

In order to achieve reasonable efficiency from a power amplifier, a mode of operation is preferred which exhibits non-linear behavior. To obtain this efficiency in the past there have been various power amplifier linearization techniques that have been utilized to meet the requirements of the Federal Communications Commission and have a desirable level of power. These prior linearization techniques have utilized feedback of the output signal into the input side of the power amplifier.

There are two types of feedback, regenerative and degenerative. Regenerative feedback is called positive feedback and degenerative feedback is called negative feedback. The positive feedback signal increases the amplitude of the original signal while the negative feedback signal decreases the amplitude of the original signal. In positive feedback, the voltage output of the amplifier is increased because the effective input voltage is increased. This greater amplification also usually increases the amount of distortion and noise in the amplifier. Additionally, in positive feedback there is produced sustained oscillations. Because of the problems associated with positive feedback, it is common to utilize negative feedback. In negative feedback, the voltage output of the amplifier is decreased because the effective input voltage is decreased. This type of feedback is used to reduce the effects of distortion, hence improving linearization. The negative feedback improves the frequency response and stability of amplifiers.

Negative feedback techniques for power amplifiers have, in the past, improved linearization to some extent. However, in current mobile and cellular communications, the requirements are becoming quite stringent for achieving the best possible quality of a narrow band signal so that the greatest number of channels can be utilized within the smallest possible range of power. In the past it has not been known to utilize a linearization technique for a power amplifier that will achieve a substantial increase in channel capacity within a given range of power.

SUMMARY OF THE INVENTION

A method and circuit for improving the linearization of a radio frequency amplifier that relates to utilizing of a feedback circuit wherein a directional coupler is used to extract a small portion (generally about 1/1000th of the power) of the output signal of the radio frequency amplifier. This feedback signal is then transmitted through an attenuator which further decreases the power of the signal to about 1/10,000th of the power of the output signal of the power amplifier. The feedback signal is then transmitted through a phase shifter such as a preselected length of a transmission line. Within a predetermined frequency band, the feedback loop transmission phase is allowed to change typically ±135 degrees with respect to band center, thus resulting in a phase margin of ±3/4. This feedback signal is then supplied to a summer which combines the feedback signal with the input signal to the power amplifier. The summed signal is now transmitted to a filter with the filter comprising a series of ganged resonators. The loaded Q of the filter is tuned to be greater than 100. The filtered signal is then transmitted into the power amplifier.

One of the primary objectives of the present invention is to significantly improve the linearization of a radio frequency power amplifier thereby permitting a substantially increased number of channels to be obtained within a given power range of a transmitter.

Another objective of the present invention is to achieve this substantially increased linearization of a power amplifier at minimal equipment expense thereby decreasing the cost of achieving this linearization from prior art techniques.

DETAILED DESCRIPTION OF THE PREFERRED EMBODIMENT

Figure 1:
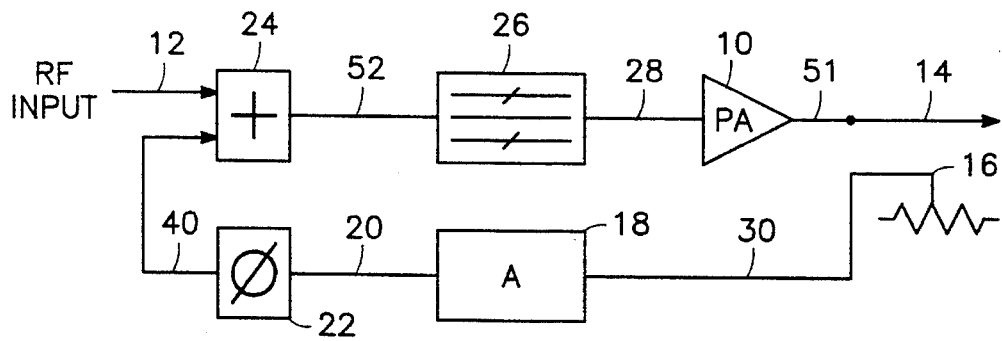
FIG. 1 is a block circuit diagram of the loss less R F feedback for a power amplifier of this invention.

Referring in particular to the drawing, there is shown in FIG. 1 a power amplifier 10 which is to be supplied a radio frequency input by transmission line 12 and produce an output within transmission line 14. Associated with the transmission line 14 is a directional coupler 16. The purpose of the directional coupler 16 is to extract a small percentage, such as 1/1000th of the power, within transmission line 14. A typical power amplification for the power amplifier 10 would be about one million to one. From the directional coupler 16 the extracted signal is fed to an attenuator 18 whose sole purpose is to further reduce the signal by a factor of ten. This means that the feedback signal located within transmission line 20 is 1/10,000th of that contained within transmission line 14. From the transmission line 20 connected to attenuator 18, the feedback signal is transmitted through a phase shifter 22. From the phase shifter 22 the signal is conducted into a summer 24. This summer 24 combines the input signal from transmission line 12 with the out of phase feedback signal from phase shifter 22. The combined signal from the summer 24 is transmitted to bandpass filter 26. From the bandpass filter 26 the signal is then supplied as a filtered signal within transmission line 28 to the input side of the power amplifier 10.

Figure 2:
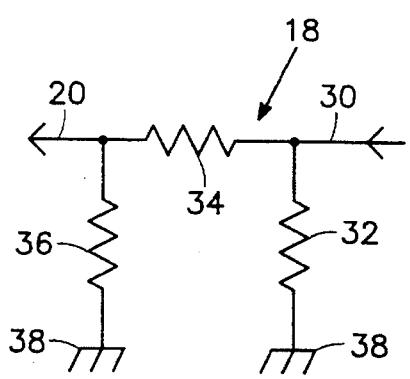
FIG. 2 is a circuit diagram of the attenuator used in this invention.

The attenuator 18 is shown in more detail in FIG. 2. The signal from the directional coupler 16 is transmitted through transmission line 30 through the series of resistors 32, 34 and 36. Resistors 32 and 36 are connected to ground 38.

The output of the attenuator 18 within transmission line 20 is supplied through the phase shifter 22. The purpose of the phase shifter 22 is to allow the transmission phase of the signal to change in the feedback loop by approximately ±135 degrees. This amount of phase shift can be preselected and one way this can occur is by selecting a prescribed length for the transmission line 40 which connects to the summer 24. A typical example would be an electrical coaxial transmission line 40.

Figure 6:
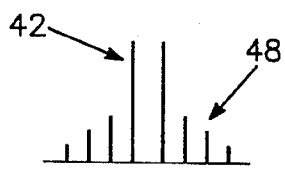
FIG. 6 is a graphical representation of a typical cellular signal which would be transmitted from a power amplifier that does not have a feedback circuit for improving linearization.
Figure 7:
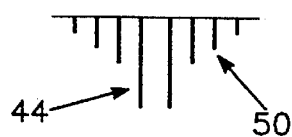
FIG. 7 is a graphical representation of the feedback signal within the circuit of the present invention.
Figure 8:
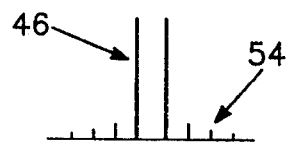
FIG. 8 is a graphical representation of the output signal of the power amplifier showing the improved quality of the signal due to the combining of the power amplifier input signal with the feedback signal.

Referring in particular to FIG. 6, there is depicted a general representation of an output signal from an amplifier that did not have any feedback arrangement. Within FIG. 6, the main components of the signal are 42 with the noise components being 48. The noise components 48 are located on both sides of the main components 42. The feedback signal is represented in FIG. 7 with the main components 44 being in the negative direction as well as the noise components 50. FIG. 6 is a representation of the signal within the transmission line 51 with FIG. 7 being a representation of the signal within transmission line 40. The combined signals are then conducted through a transmission line 52 to the bandpass filter 26. Within the bandpass filter the overall signals are shaped with only a signal within a certain megahertz range being transmitted through the transmission line 28. For example, if the bandpass filter is selected to transmit signals only in the range of 454 MHz, this transmission will occur ±one MHz. That means that the signal within transmission line 28 will be within the range of 453 to 455 MHz. This now combined signal is then amplified tremendously by the amplifier 10 with the canceling effect now occurring between the two signals. The result is the output signal within transmission line 14 is shown to appear as is in FIG. 8 where the main components 46 are still well pronounced but the noise components 54 are substantially diminished.

Figure 3:
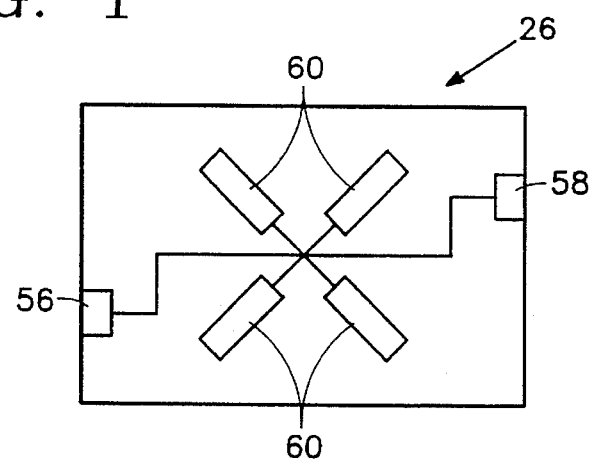
FIG. 3 is a schematic view of the bandpass filter used in this invention.

It is to be understood that for the desired shaping of the signal to occur by the bandpass filter 26, the bandpass filter 26 must be constructed as is shown in FIG. 3. Transmission line 52 is to connect with connector 56 with transmission line 28 connecting with connector 58. Through the bandpass filter 26 the signal is resonated by a ganged series of resonators 60.

Figure 4:
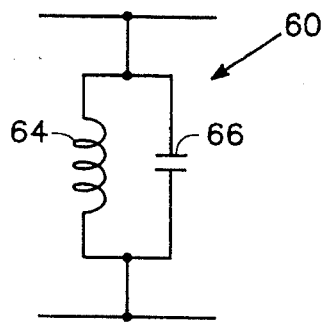
FIG. 4 is a circuit diagram of one of the resonators used within the bandpass filter of FIG. 3.

The structure of each resonator 60 is shown in FIG. 4 which comprises a parallel arrangement of an inductor 64 and a capacitor 66.

Figure 5:
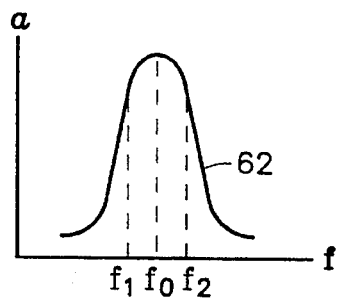
FIG. 5 is an amplitude/frequency curve of a typical signal transmitted through the circuit of the present invention.

The series of resonators 60 each produce a value of Q with the Q values of the four resonators 60 being additive. In referring to FIG. 5 there is a signal representation 62 within an amplitude/frequency graph. The maximum amplitude of the signal 62 occurs at frequency $f_0$. Let it be assumed that the highest level of the frequency that is to be transmitted by the bandpass filter 26 is called $f_2$ with the lowest frequency to be transmitted by the bandpass filter 26 being called $f_1$.

$$Q = \frac{f_0}{f_2 - f_1}$$

It has been found that optimum performance is obtained when the value for Q is equal to or greater than one hundred with it being preferred that Q be between one hundred and one hundred and ten.

The subject matter of this invention presents a loss less feedback approach for power amplifier linearization for a mobile transmitting station and cluster applications. It achieves this linearization by narrow band negative feedback to provide temperature and aging stability and to reduce both bit error rate and spectrum spreading. The reducing of spectrum spreading is required for FCC compliance.

The subject matter of this invention has been demonstrated to be effective at 454 MHz and 358 MHz, but it is just as applicable at microwave and millimeter-wave frequencies. Usage of the linearization technique will be effective within mobile and cellular installations, personal communication services and microwave communication bands.

When applied to a 454 MHz and 358 MHz RF power amplifier, the linearization technique of this invention suppresses the intermodulation products in a multi-carrier situation by a minimum of eighteen decibels ±one MHz without compromising the amplifier's unconditional stability.

Regarding the bandpass filter 26, it is understood that not only does the filter 26 shape the loop gain but also determines what portion of the band is not canceled and what portion of the band is canceled. To insure stability, it is of prime importance to make sure that the loop gain is greater than one over a predetermined frequency band. All through this band the loop transmission phase is allowed to change by ±135 degrees with respect to band center thus allowing more than adequate phase margin for stability. The loop delay causes a phase change across the band. This phase change is produced by the electrical conductor which constitutes a phase shifter 22. The filter 26 is designed for the best obtainable results between intermodulation distortion suppression and unconditional stability. In the feedback loop, the phase is adjusted to insure negative feedback at the band center.

What is claimed is:

1. A method of improving the linearization of a radio frequency amplifier comprising the steps of:

extracting a small portion of the output power of said amplifier producing a feedback signal;

transmitting said feedback signal through a phase shifter allowing the phase to change in the transmission feedback loop to approximately ±135 degrees;

transmitting said feedback signal through a summer with an input signal producing a summed signal;

transmitting said summed signal through a filter altering the value of Q by at least one hundred producing a filtered signal; and transmitting said filtered signal into said power amplifier.

2. The method as defined in claim 1 wherein within the extracting step the small portion comprises about 1/10000th of the output power of said amplifier.

3. The method as defined in claim 1 wherein said first transmitting step includes attenuating of said feedback signal decreasing the power of said feedback signal to approximately 1/10,000th of said output power of said amplifier.

4. A negative feedback circuit for improving linearity of a power amplifier, said power amplifier having an input signal and an output signal, said power amplifier amplifying over a frequency range having a band center; said circuit comprising:

directional coupler means for extracting a small portion of said output signal generating a feedback signal;

phase adjuster means located within said circuit for changing the phase of said feedback signal, said phase adjuster means changing the phase of said feedback signal to have negative feedback at said band center, said phase adjuster means allows the phase of said feedback signal to change by approximately ±135 degrees with respect to said band center;

summer means located in said circuit for combining said feedback signal with said input signal generating a summed signal;

filter means located within said circuit for filtering said summed signal generating a filtered signal, said filter means altering the value of Q of said summed signal by an increased amount of at least one hundred; and means for transmitting said filtered signal into said power amplifier.

5. The circuit as defined in claim 4 wherein:

said feedback signal being approximately 1/1000th of the power of said output signal.

6. The circuit as defined in claim 4 wherein:

attenuator means mounted within said circuit, said attenuator means decreasing the power of said feedback signal to approximately 1/10,000th of the power of said output signal.

7. The circuit as defined in claim 4 wherein:

said phase adjuster means comprising a preselected length of an electrical conductor.

* * * * *